United States Patent
Iida

(10) Patent No.: US 9,818,378 B2
(45) Date of Patent: Nov. 14, 2017

(54) DISPLAY APPARATUS COMPRISING BIDIRECTIONAL MEMORIES AND METHOD FOR DRIVING THE SAME

(71) Applicant: Mitsubishi Electric Corporation, Tokyo (JP)

(72) Inventor: Yohei Iida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 214 days.

(21) Appl. No.: 14/820,157

(22) Filed: Aug. 6, 2015

(65) Prior Publication Data

US 2016/0055616 A1 Feb. 25, 2016

(30) Foreign Application Priority Data

Aug. 21, 2014 (JP) .................................. 2014-168055

(51) Int. Cl.
*G09G 3/36* (2006.01)
*G09G 5/393* (2006.01)
(Continued)

(52) U.S. Cl.
CPC ........... *G09G 5/393* (2013.01); *G09G 3/3611* (2013.01); *G09G 3/3674* (2013.01); *G09G 3/3685* (2013.01); *G09G 2330/06* (2013.01); *G09G 2340/0435* (2013.01); *G09G 2350/00* (2013.01); *G09G 2352/00* (2013.01);
(Continued)

(58) Field of Classification Search
None
See application file for complete search history.

(56) References Cited

U.S. PATENT DOCUMENTS 5,771,031 A * 6/1998 Kinoshita ............ G09G 3/3666
345/100
7,170,505 B2 1/2007 Akahori
(Continued)

FOREIGN PATENT DOCUMENTS

CN 1551090 A 12/2004
CN 101714326 A 5/2010
(Continued)

OTHER PUBLICATIONS

The First Office Action issued by the Chinese Patent Office dated Jun. 2, 2017, which corresponds to Chinese Patent Application No. 201510514813.7 and is related to U.S. Appl. No. 14/820,157; with English language partial translation.

*Primary Examiner* — Joni Richer
(74) *Attorney, Agent, or Firm* — Studebaker & Brackett PC

(57) ABSTRACT

A display apparatus according to the present invention includes: N driver ICs (first to third driver ICs); N or more bidirectional memories (first to third bidirectional memories) that simultaneously allow data writing and data reading; a phase locked loop that converts an input clock to an output clock; a write controller that writes data to the plurality of bidirectional memories in synchronization with the input clock; and a read controller that reads the data from the plurality of bidirectional memories and causes the data to be output to the plurality of driver ICs in synchronization with the output clock. A frequency of the output clock is smaller than a frequency of the input clock and is larger than 1/N times the frequency of the input clock.

8 Claims, 6 Drawing Sheets

(51) Int. Cl.
    *G11C 11/419*        (2006.01)
    *G11C 7/22*          (2006.01)

(52) U.S. Cl.
    CPC ..... *G09G 2360/12* (2013.01); *G09G 2370/08* (2013.01); *G09G 2370/14* (2013.01); *G11C 7/22* (2013.01); *G11C 11/419* (2013.01)

(56) References Cited

U.S. PATENT DOCUMENTS

| | | |
|---|---|---|
| 8,749,535 B2 | 6/2014 | Kim et al. |
| 2001/0005195 A1 | 6/2001 | Ichiraku |
| 2002/0080107 A1 | 6/2002 | Fujimoto et al. |
| 2003/0067434 A1 | 4/2003 | Haga et al. |
| 2004/0183794 A1 | 9/2004 | Akahori |
| 2006/0237727 A1 | 10/2006 | Haga et al. |
| 2010/0085084 A1* | 4/2010 | Kim ............... G09G 3/3648 327/108 |
| 2011/0148851 A1 | 6/2011 | Sugiyama et al. |
| 2014/0104256 A1* | 4/2014 | Oohira ............ G09G 3/3614 345/209 |

FOREIGN PATENT DOCUMENTS

| | | |
|---|---|---|
| CN | 102103847 | 6/2011 |
| JP | H10-207434 A | 8/1998 |
| JP | 2001-184028 A | 7/2001 |
| JP | 2002-202760 A | 7/2002 |
| JP | 2009-151243 A | 7/2009 |
| JP | 2009-187024 A | 8/2009 |

* cited by examiner

DISPLAY APPARATUS COMPRISING BIDIRECTIONAL MEMORIES AND METHOD FOR DRIVING THE SAME

BACKGROUND OF THE INVENTION

Field of the Invention

The present invention relates to a display apparatus and a method for driving the same.

Description of the Background Art

Liquid crystal display apparatuses typically include video signal processors that convert video signals input from external devices to desired signal formats. The video signal processors perform various drawing processes and timing adjustments.

The video data signals whose formats have been converted by the video signal processors are transferred to liquid crystal panel driving driver ICs through wire cables for transmitting signals and circuit substrates (such as rigid substrates and flexible substrates).

In recent times, various data formats have been developed and introduced to increase an amount of data transfers per one signal wire. For example, a mini-LVDS mode being one of differential signaling modes is capable of transmitting up to 8 bits of video signals by a pair (a group of two) of signal wires. Such differential signaling mode is not only able to reduce the number of signal wires, but also has a characteristic that the mode is hardly influenced by external noise, thereby being currently used for many liquid crystal display apparatuses.

To increase the amount of data transfers per one signal wire, however, transmission speed of output data needs to be sufficiently faster than that of input data. In an example of the above-mentioned mini-LVDS transmission, transfer speed needs to be three times faster when transmitting 6-bit data and needs to be four times faster when transmitting 8-bit data. If the data transfer speed is increased in this manner, an influence on stray capacitance and wiring inductance on substrate wiring cannot be ignored, thus causing to increase a level of radiation noise. Upon a design of a layout of transmission wiring, wiring needs to be disposed in consideration of the characteristics (such as parasitic capacitance). Moreover, for example, a noise countermeasure component needs to be installed as necessary, thereby simply causing an increase in cost and an area of a substrate.

To solve the problems, measures to divide transfer data between a video signal processor and a driver IC by an odd number and an even number to reduce transfer speed of the output data by half and a method for reducing transfer speed using a plurality of line memories (see Japanese Patent Application Laid-Open No. 10-207434 (1998), for example) have been taken into consideration.

A method for reading data temporarily stored in a memory at a frequency of each RGB (see Japanese Patent Application Laid-Open No. 2009-151243) is also considered.

In the mode that divides the output data by the even number and the odd number for the transfer, the number of data wires doubles, and thus a region of wires in a circuit substrate doubles. This results in an increased area of the substrate. Furthermore, a problem arises that power consumption used for data signals doubles. Moreover, the mode is only applicable to a driver IC compatible with the same mode, so that the use of the mode causes constraints of components.

The conventional mode using the line memories (or parallel driving that divides output into two) waits for completion of data writing of one horizontal period and performs data reading. In this case, the line memories of at least two horizontal periods are needed to avoid overwriting of data stored in a memory. Thus, when a SRAM is built in a video signal processing integrated circuit for cost reduction, the SRAM takes up an increased area of a chip.

Then, a method for reducing transfer speed of output by half (dividing output into two) is known, but the number of data clocks during a data blank period is also reduced by half, thereby possibly resulting in insufficient constraints of timing determined by a driver IC at a subsequent stage depending on a usage state. To solve the problem, a demand for the data blank period to input equipment needs to be expanded, and existing equipment may not be possibly used in some cases.

SUMMARY OF THE INVENTION

It is an object of the present invention to provide a display apparatus capable of suppressing transfer speed of data input to a driver IC and securing a blank period without depending on an input video signal on the display apparatus side and to provide a method for driving the display apparatus.

A display apparatus according to the present invention includes: N driver ICs; N or more bidirectional memories that simultaneously allow data writing and data reading; a phase locked loop that converts an input clock to an output clock; a write controller that writes data to the plurality of bidirectional memories in synchronization with the input clock; and a read controller that reads the data from the plurality of bidirectional memories and causes the data to be output to the plurality of driver ICs in synchronization with the output clock. In the display apparatus according to the present invention, a frequency of the output clock is smaller than a frequency of the input clock and is larger than 1/N times the frequency of the input clock.

The display apparatus according to the present invention can suppress the transfer speed of the output data more than that of the input data and secure a timing margin (blank period of the output data) without depending on the input video signal.

These and other objects, features, aspects and advantages of the present invention will become more apparent from the following detailed description of the present invention when taken in conjunction with the accompanying drawings.

DESCRIPTION OF THE PREFERRED EMBODIMENTS

Prerequisite Technology

Figure 6:
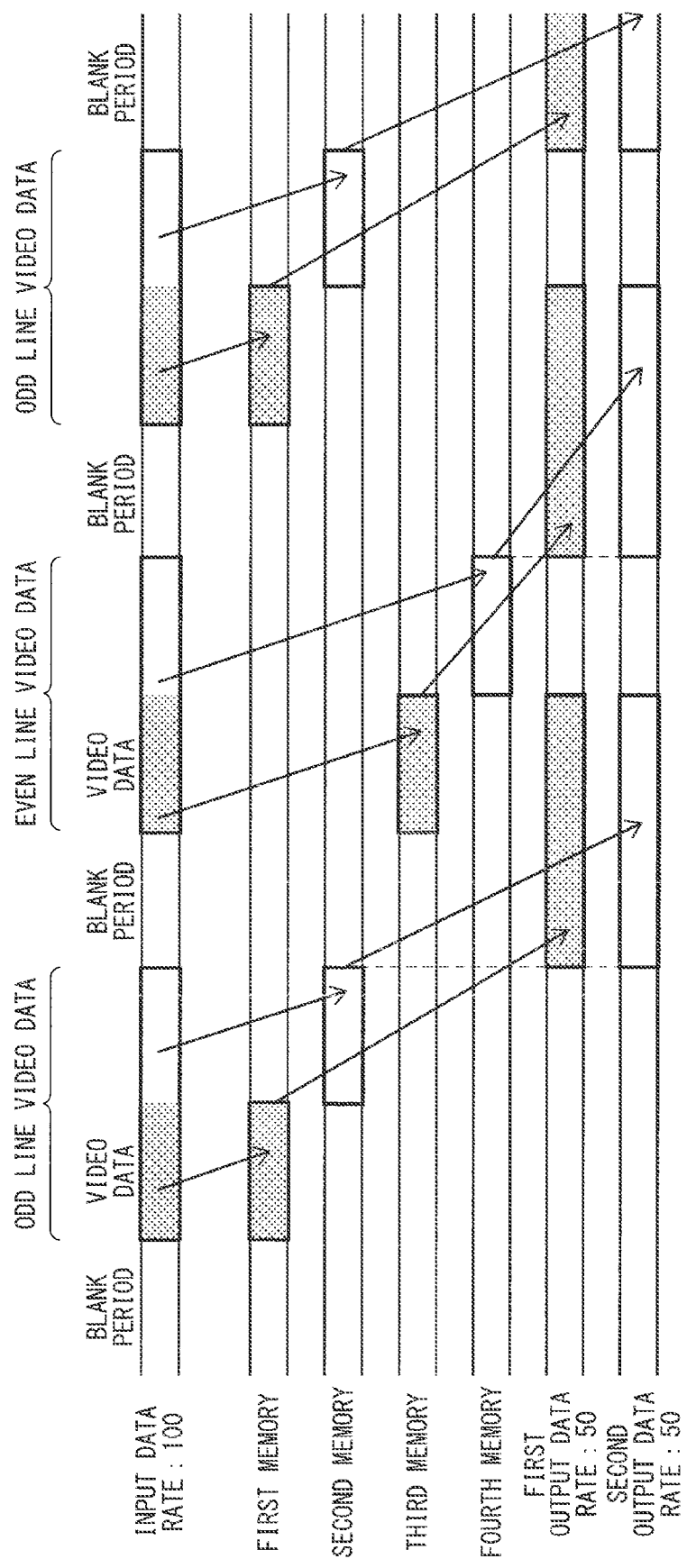
FIG. 6 is a diagram showing sequence of data writing and data reading in a display apparatus according to a prerequisite technology.

A prerequisite technology of the present invention is described before preferred embodiments of the present invention are described. FIG. 6 is a diagram showing sequence of data writing to and data reading from line memories in the prerequisite technology. The display apparatus in the prerequisite technology includes the line memories (first to fourth memories) of two horizontal periods, a first driver IC, and a second driver IC. In the prerequisite technology, data writing is performed in the first to fourth memories at a clock frequency F, and data reading is performed in the first to fourth memories at a clock frequency F/2.

As shown in FIG. 6, first, a first half (left half) of odd line video data is written to the first memory. Then, a second half (right half) of the odd line video data is written to the second memory. When even line video data is input, a first half (left half) of the even line video data is written to the third memory. Then, a second half (right half) of the even line video data is written to the fourth memory. The series of writing operations for the first to fourth memories are a write unit cycle, i.e., a period of the write unit cycle includes an input period and a writing period of the odd line video data, and an input period and a writing period of the even line video data.

Next, reading operations are described. As shown in FIG. 6, after completion of the writing to the second memory, data reading from the first and second memories is started at the same. The data read from the first and second memories is outputted to each LCD driver IC. Next, after completion of the writing to the fourth memory, data reading from the third and fourth memories is started at the same time. The data read from the third and fourth memories is then outputted to each LCD driver IC. The series of the reading operations described above are repeated in the first to fourth memories. A blank period in the reading operations is defined by a period needed for the writing operations (a period in which data of a horizontal period of the half of a screen is written).

In the prerequisite technology using the line memories (parallel driving that divides output into two), after waiting for completion of the data writing of one horizontal period, the data reading is performed. In this case, line memories of at least two horizontal periods are needed to avoid overwriting of data stored in a memory. Thus, when a SRAM is built in a video signal processing integrated circuit for cost reduction, the SRAM takes up an increased area of a chip.

Then, if transfer speed of output is reduced by half (output is divided into two), the number of data clocks during a data blank period is also reduced by half, thereby possibly resulting in insufficient constraints of timing determined by a driver IC at a subsequent stage depending on a usage state. To solve the problem, a demand for the data blank period to input equipment needs to be expanded, and existing equipment may not be possibly used in some cases.

First Preferred Embodiment

<Configuration>

Figure 1:
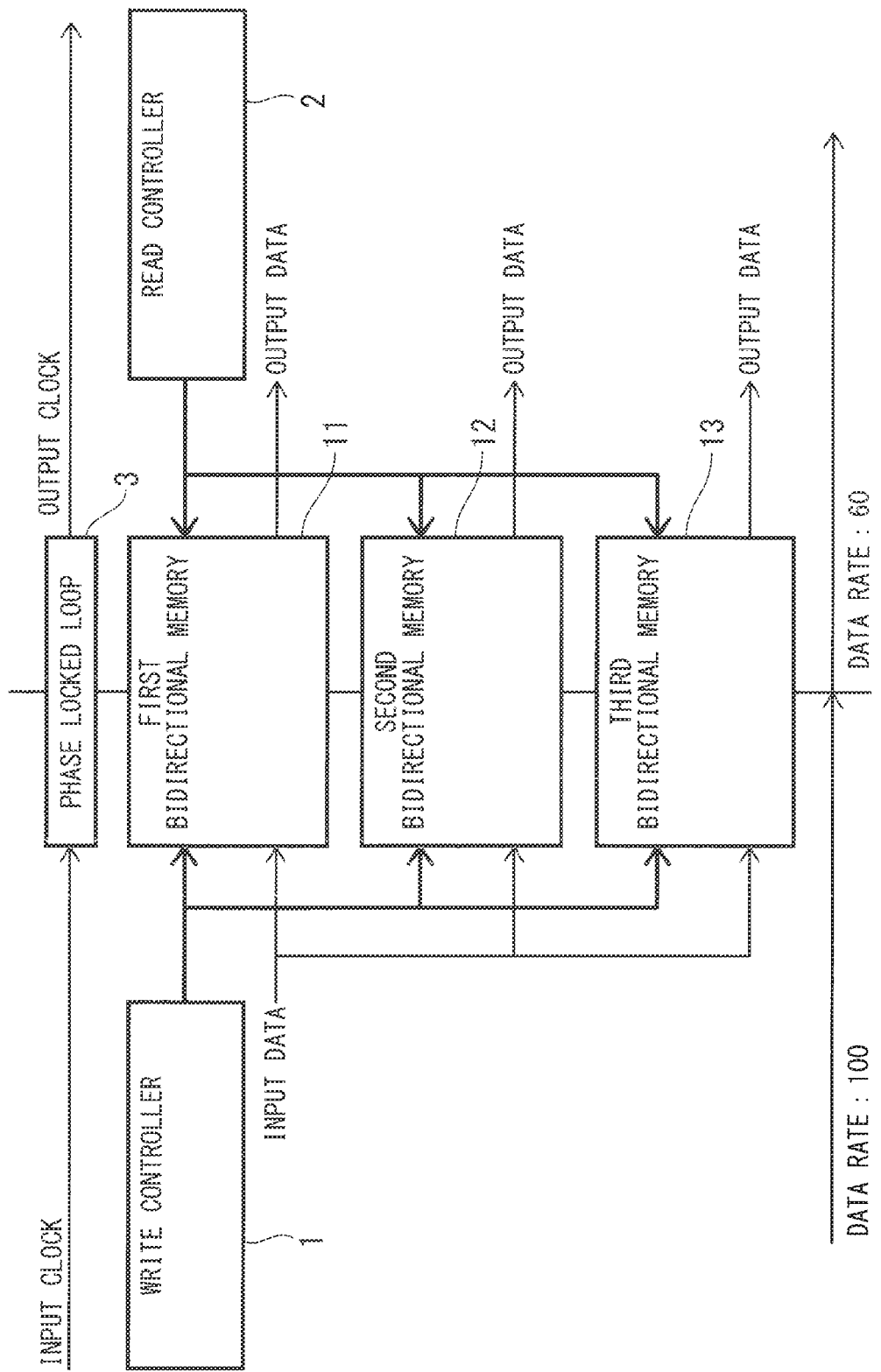
FIG. 1 is a functional block diagram of a video signal processor in a display apparatus according to a first preferred embodiment.
Figure 2:
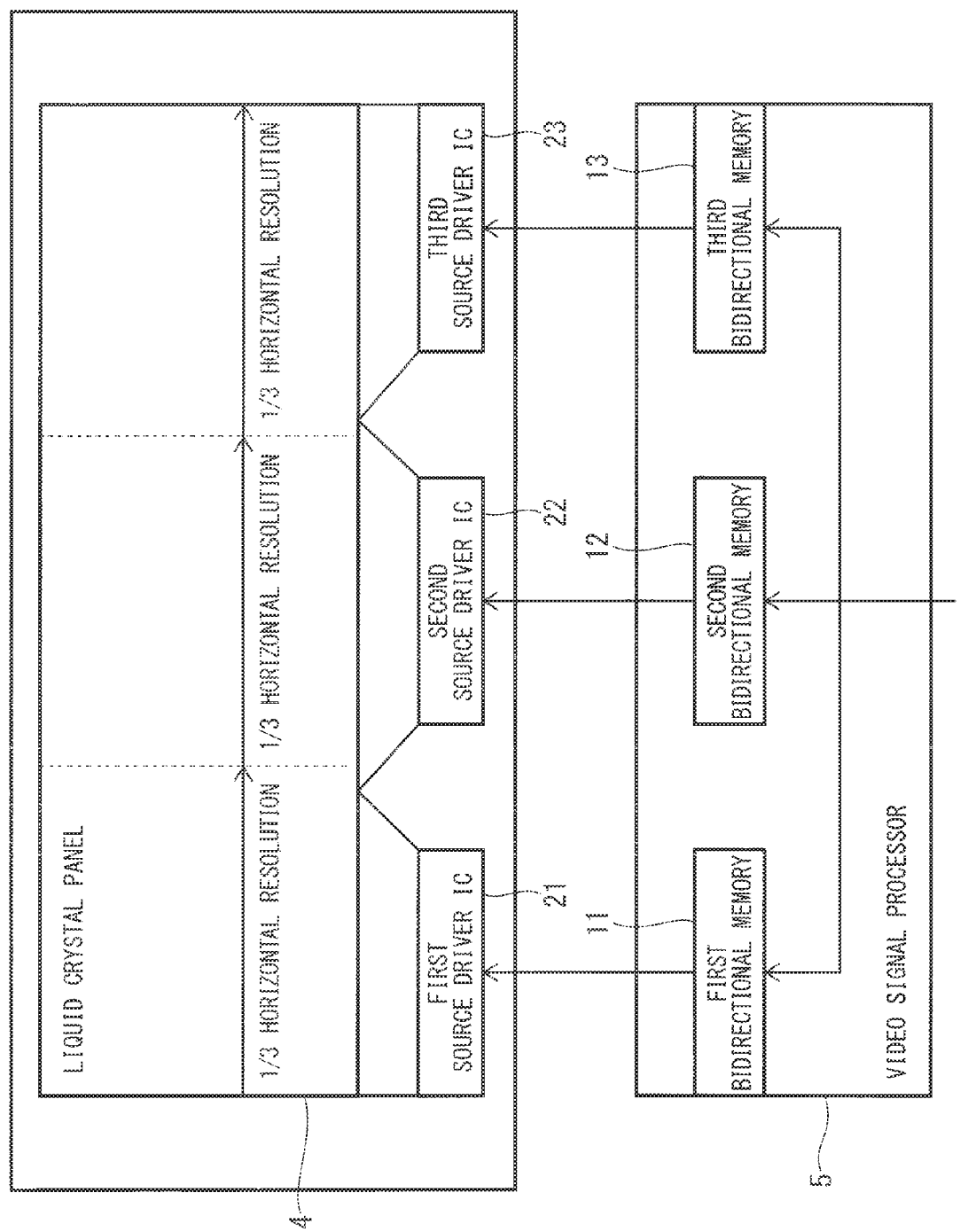
FIG. 2 is a functional block diagram showing a relationship among a liquid crystal panel, source driver ICs, and bidirectional memories in the display apparatus according to the first preferred embodiment.

FIG. 1 is a functional block diagram of a video signal processor 5 included in a display apparatus according to a first preferred embodiment. FIG. 2 is a functional block diagram showing a relationship among a liquid crystal panel 4, source driver ICs, and bidirectional memories in the display apparatus according to the first preferred embodiment.

The video signal processor 5 includes a first bidirectional memory 11, a second bidirectional memory 12, and a third bidirectional memory 13 for storing data (hereinafter may be respectively referred to as a first memory 11, a second memory 12, and a third memory 13), a write controller 1, a read controller 2, and a phase locked loop 3.

Here, the first to third bidirectional memories 11, 12, 13 are memories that simultaneously allow writing and reading, the memories being static random access memories (SRAMs), for example. In the first preferred embodiment, one memory is allocated to one driver IC, but the number of memories allocated to one driver IC may be two or more.

The display apparatus further includes a first source driver IC 21, a second source driver IC 22, and a third source driver IC 23. Data read from the first to third memories 11, 12, 13 is input to the first to third source driver ICs 21, 22, 23, respectively. Each of the first to third source driver ICs 21, 22, 23 drives the corresponding region of the liquid crystal panel 4, the region having been split in three in the horizontal direction.

A video signal input to the video signal processor 5 is continuously written to the first to third memories 11, 12, 13 by a write control signal generated on the basis of an input clock. In the first preferred embodiment, data of a ⅓ horizontal resolution is stored in one memory.

An output clock for operating the read controller 2 is generated in the phase locked loop 3 using the input clock. In a case of the first preferred embodiment, a theoretical minimum frequency of the output clock is ⅓ of the frequency of the input clock. However, in this embodiment the output clock is set to ⅗ times of the input clock to secure a blank period (timing margin) of output data. A ratio of the frequency of the input clock to the frequency of the output clock is 5:3, and transfer speed of the output data is 60% of that of the input data.

<Operations>

Figure 3:
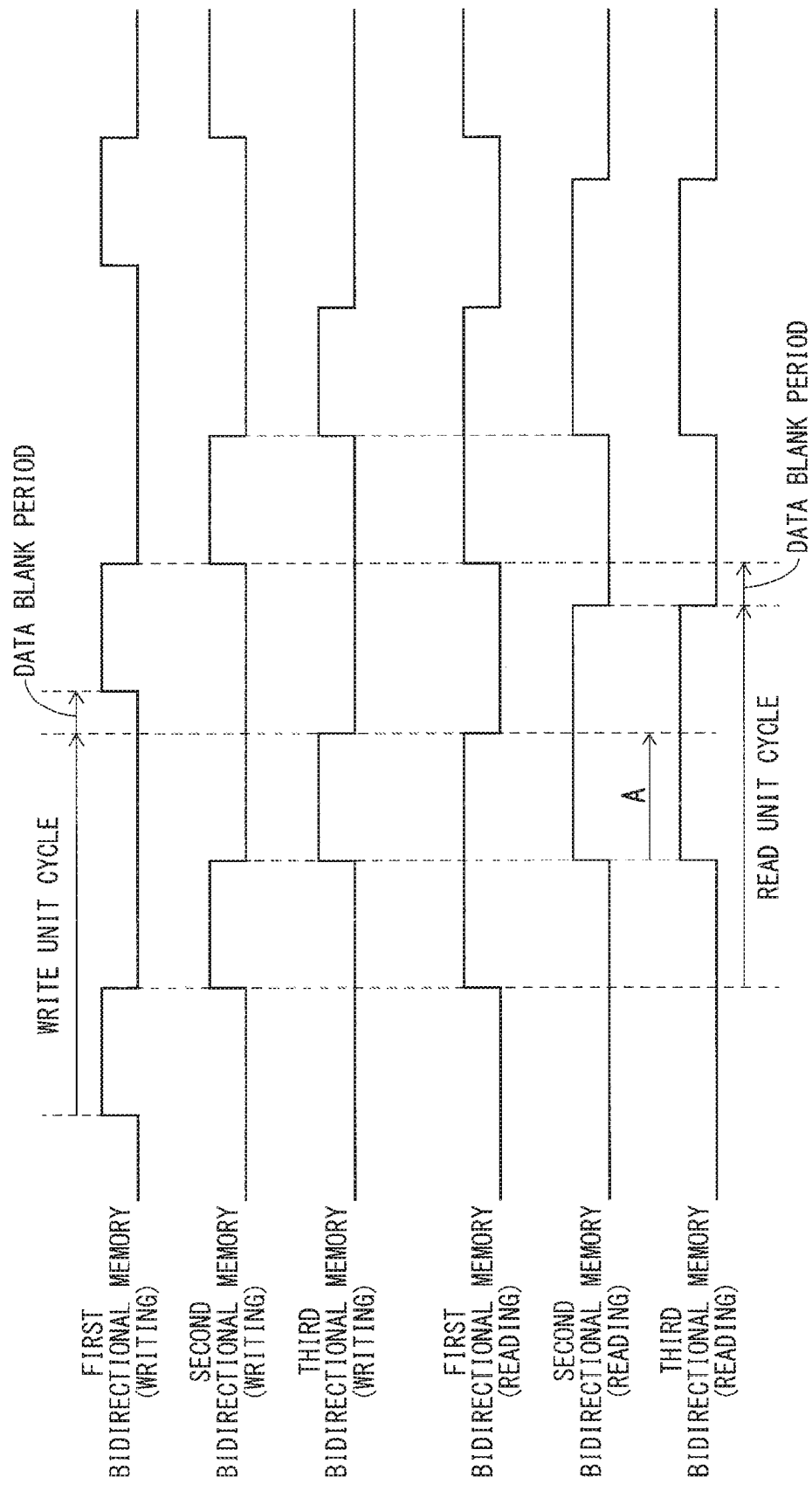
FIG. 3 is a diagram showing sequence of data writing and data reading in the display apparatus according to the first preferred embodiment.

First, writing operations (writing steps) are described. As shown in FIG. 3, the write controller 1 writes data of the left ⅓ horizontal resolution to the first memory 11. When the data writing to the first memory is completed, the write controller 1 then starts to write data of the center ⅓ horizontal resolution to the second memory 12. When the data writing to the second memory is completed, the write controller 1 then starts to write data of the right ⅓ horizontal resolution to the third memory 13. The series of the writing operations described above are a write unit cycle. With a write blank period, the write controller 1 repeats the write unit cycle.

Next, reading operations (reading steps) are described. As shown in FIG. 3, the read controller 2 starts data reading from the first memory 11 at the instant of completion of the data writing to the first memory 11. Here, a time corresponding to a time for writing data of approximately a ⅔ horizontal resolution based on input conversion is needed to complete reading from one memory (see FIG. 3).

Furthermore, the read controller 2 starts data reading from the second and third memories 12, 13 at the instant of completion of the data writing to the second memory 12. In addition, when data reading from a memory starts, the reading starts with a delay of at least 1 address or more to avoid a conflict with an address in the memory. The reason is that when data writing and data reading are simultaneously performed in the address, the operations are not guaranteed.

The series of the reading operations described above are a read unit cycle. With a read blank period, the read controller 2 repeats the read unit cycle.

As shown in FIG. 3, in the first preferred embodiment, the data reading is performed during the data writing in the third memory 13 among the plurality of bidirectional memories (overlap period A in FIG. 3). The data is simultaneously read from the second and third memories 12, 13 among the plurality of bidirectional memories. The read period of the first memory 11 partially overlaps the read periods of the second and third memories 12, 13.

As described above, the read unit cycle in the first preferred embodiment is ⅝ H+α. Here, H is the corresponding time for writing data of one horizontal resolution, and α is a time for a countermeasure against a conflict with an address. When the write unit cycle is compared to the read unit cycle, it is clear that a blank period (timing margin) of approximately a ⅑ H can be secured.

<Effects>

The display apparatus in the first preferred embodiment includes: the N driver ICs (the first to third driver ICs 21, 22, 23); the N or more bidirectional memories (the first to third bidirectional memories 11, 12, 13) that simultaneously allow the data writing and the data reading; the phase locked loop 3 that converts the input clock to the output clock; the write controller 1 that writes data to the plurality of bidirectional memories in synchronization with the input clock; and the read controller 2 that reads the data from the plurality of bidirectional memories and causes the data to be output to the plurality of driver ICs in synchronization with the output clock. The frequency of the output clock is smaller than the frequency of the input clock and is larger than 1/N times the frequency of the input clock.

Therefore, the display apparatus in the first preferred embodiment includes the N or more bidirectional memories (in other words, the first to third memories 11, 12, 13), the data reading is performed during the data writing in at least one of the plurality of bidirectional memories, and the data is simultaneously read from at least two of the plurality of bidirectional memories. Consequently, a value of the output clock can be set smaller than the input clock and larger than 1/N times the input clock. This enables to suppress transfer speed of the output data more than that of the input data and to secure the timing margin (blank period of the output data) without depending on an input video signal.

Moreover, this eliminates the need for dividing the output data wires by the even number and the odd number unlike Japanese Patent Application Laid-Open No. 10-207434 (1998), so that the display apparatus in the first preferred embodiment is not influenced by an increased region of wires or increased power consumption due to an increase in the number of data. A driver IC for dividing odd-numbered data and even-numbered data does not need to be used, and thus a range of choices can be expanded.

In the first preferred embodiment, overwriting of data does not occur in the memories, eliminating the need for line memories of two horizontal periods unlike the prerequisite technology. Thus, the first preferred embodiment preferably has a configuration including line memories of one horizontal period, and thus the number of memories can be reduced more than that in the prerequisite technology.

In the first preferred embodiment, the transfer speed of the output data is suppressed, which can suppress radiation noise and can relax constraints of a layout upon a design of substrate wiring. In some cases, a noise countermeasure component is not needed, thereby expecting a reduced cost by reducing the number of components.

In the first preferred embodiment, a liquid crystal display apparatus can handle constraints of an input signal of a liquid crystal panel driving driver IC. This can reduce dependence of the driver IC on a timing design on input equipment side. Thus, an influence on various input equipment is small, and the conventional display apparatus can easily be replaced by the display apparatus of the present invention.

In the display apparatus in the first preferred embodiment, the write controller 1 repeats the write unit cycle with the write blank period, the write unit cycle being a cycle of sequentially writing the data to the plurality of bidirectional memories, the read controller 2 repeats the read unit cycle with the read blank period, the read unit cycle being a cycle of reading the data from the plurality of bidirectional memories, the data writing and the data reading are simultaneously performed in at least one of the plurality of bidirectional memories (for example, the third memory 13), data is simultaneously read from at least two of the plurality of bidirectional memories (for example, the second and third memories 12, 13), and a time obtained by adding the read unit cycle and the read blank period does not exceed a time obtained by adding the write unit cycle and the write blank period.

Therefore, in the display apparatus in the first preferred embodiment, the data writing and the data reading are simultaneously performed in at least one of the plurality of bidirectional memories, and the data is simultaneously read from at least two of the plurality of bidirectional memories. This enables to suppress transfer speed of the output data more than that of the input data and to secure the timing margin (blank period of the output data) without depending on the input video signal.

The N or more bidirectional memories are the first to third bidirectional memories 11, 12, 13. The write controller 1 performs the writing in the first to third bidirectional memories 11, 12, 13 in the stated order. The writing to the third bidirectional memory 13 and the reading from the third bidirectional memory 13 are simultaneously performed. The first to third bidirectional memories 11, 12, 13 have the periods in which the reading is simultaneously performed.

Therefore, the writing to the third bidirectional memory 13 and the reading from the third bidirectional memory 13 are simultaneously performed, and the first to third bidirectional memories 11, 12, 13 have the periods in which the reading is simultaneously performed. This enables to suppress an output data rate to approximately 60% of an input data rate and to secure the blank period of the output data without depending on the input video signal.

The method for driving a liquid crystal display apparatus in the first preferred embodiment includes: repeating the write unit cycle with the write blank period by the write controller 1, the write unit cycle being a cycle of sequentially writing the data to the plurality of bidirectional memories; and repeating the read unit cycle with the read blank period by the read controller 2, the read unit cycle being a cycle of reading the data from the plurality of bidirectional memories. In the repeating the write unit cycle and the repeating the read unit cycle, the data writing and the data reading are simultaneously performed in at least one of the plurality of bidirectional memories. In the repeating the read unit cycle, the data is simultaneously read from at least two of the plurality of bidirectional memories. A time obtained by adding the read unit cycle and the read blank period does not exceed a time obtained by adding the write unit cycle and the write blank period.

Therefore, in the method for driving a display apparatus in the first preferred embodiment, in the repeating the write unit cycle and the repeating the read unit cycle, the data writing and the data reading are simultaneously performed in at least one of the plurality of bidirectional memories. In the repeating the read unit cycle, the data is simultaneously read from at least two of the plurality of bidirectional memories. This enables to suppress transfer speed of the output data more than that of the input data and to secure the timing margin (blank period of the output data) without depending on the input video signal.

In the method for driving a display apparatus in the first preferred embodiment, the N or more bidirectional memories are the first to third bidirectional memories 11, 12, 13, the write controller 1 performs the writing in the first to third bidirectional memories 11, 12, 13 in the stated order in the repeating the write unit cycle, the writing to the third bidirectional memory 13 and the reading from the third bidirectional memory 13 are simultaneously performed in the repeating the write unit cycle and the repeating the read unit cycle, and the first to third bidirectional memories 11, 12, 13 have the periods in which the reading is simultaneously performed in the repeating the read unit cycle.

Therefore, in the repeating the write unit cycle and the repeating the read unit cycle, the writing to the third bidirectional memory 13 and the reading from the third bidirectional memory 13 are simultaneously performed. In the repeating the read unit cycle, the first to third bidirectional memories 11, 12, 13 have the periods in which the reading is simultaneously performed. This enables to suppress the output data rate to approximately 60% of the input data rate and to secure the blank period of the output data without depending on the input video signal in the display apparatus.

Second Preferred Embodiment

<Configuration>

Figure 4:
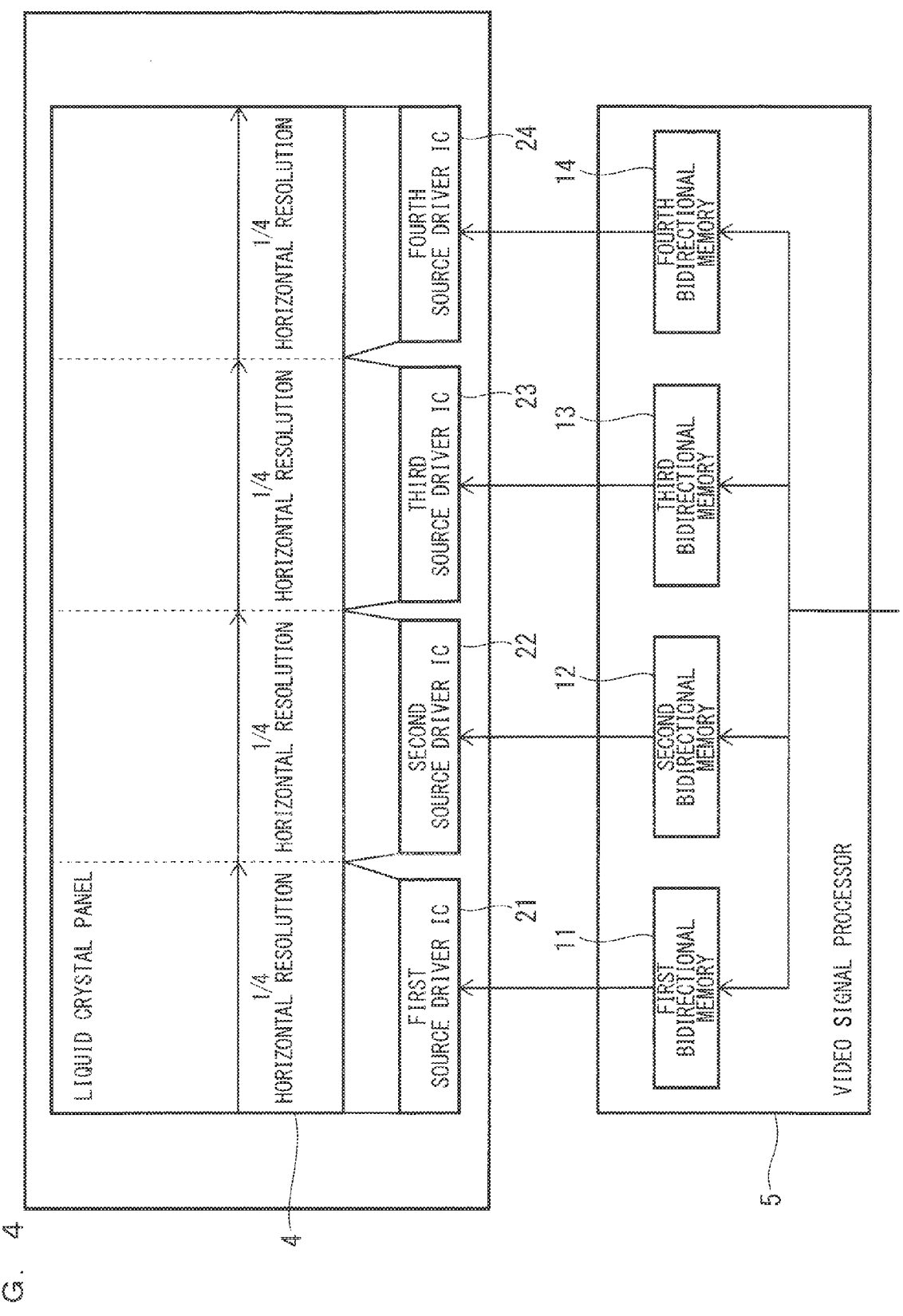
FIG. 4 is a functional block diagram showing a relationship among a liquid crystal panel, source driver ICs, and bidirectional memories in a display apparatus according to a second preferred embodiment.

FIG. 4 is a functional block diagram showing a relationship among a liquid crystal panel, source driver ICs, and bidirectional memories in a display apparatus according to a second preferred embodiment. The display apparatus in the second preferred embodiment includes first to fourth source driver ICs 21, 22, 23, 24. A video signal processor 5 includes first to fourth bidirectional memories 11, 12, 13, 14. The other configurations are similar to those in the first preferred embodiment, so that descriptions are omitted.

In a configuration including four pairs of the source driver ICs and the memories, a limit of a data transfer speed is theoretically ¼ times, but the data transfer speed in the second preferred embodiment is set to ⅖ times.

<Operations>

Figure 5:
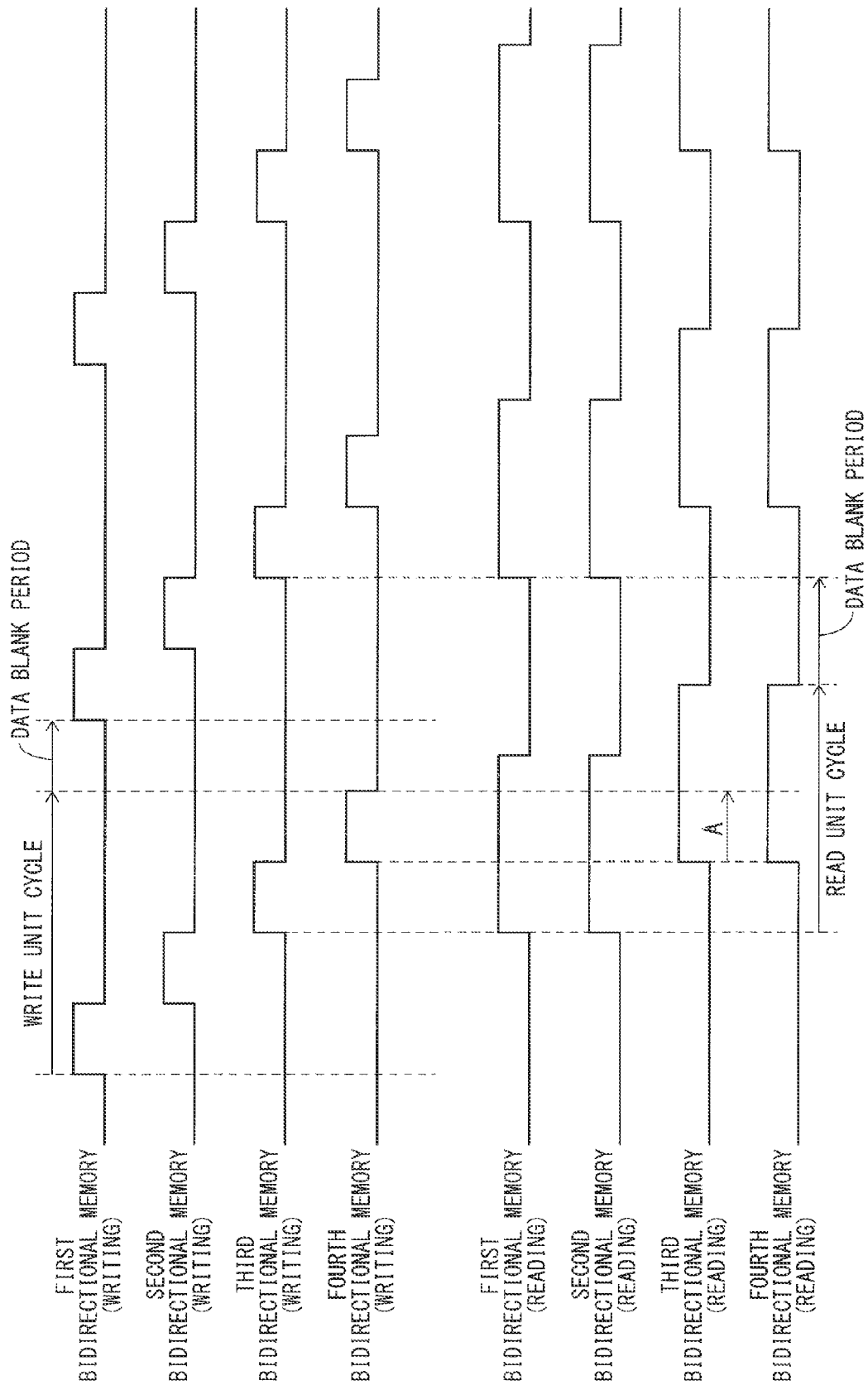
FIG. 5 is a diagram showing sequence of data writing and data reading in the display apparatus according to the second preferred embodiment.

First, writing operations (writing steps) are described. As shown in FIG. 5, the write controller 1 sequentially writes data of a ¼ horizontal resolution to the first to fourth memories 11, 12, 13, 14. The series of the writing operations are a write unit cycle. With a write blank period, the write controller 1 repeats the write unit cycle.

Next, reading operations (reading steps) are described. As shown in FIG. 5, the read controller 2 starts data reading from the first and second memories 11, 12 at the instant of completion of the data writing to the second memory 12. Furthermore, the read controller 2 starts data reading from the third and fourth memories 13, 14 at the instant of completion of the data writing to the third memory 13. The series of the reading operations described above are a read unit cycle. With a read blank period, the read controller 2 repeats the read unit cycle.

As shown in FIG. 5, in the second preferred embodiment, the data reading is performed during the data writing in the fourth memory 14 among the plurality of bidirectional memories (overlap period A in FIG. 5). The data is simultaneously read from the first and second memories 11, 12 among the plurality of bidirectional memories. The data is simultaneously read from the third and fourth memories 13, 14. The read periods of the first and second memories 11, 12 partially overlap the read periods of the third and fourth memories 13, 14.

As described above, the read unit cycle in the second preferred embodiment is $\frac{7}{8}$ H+$\alpha$ (where $\alpha$ is a time for a countermeasure against a conflict with an address). When the write unit cycle is compared to the read unit cycle, it is clear that a blank period (timing margin) of approximately a $\frac{1}{8}$ H can be secured.

<Effects>

In the display apparatus in the second preferred embodiment, the N bidirectional memories are the first to fourth bidirectional memories 11, 12, 13, 14, the write controller 1 performs the writing in the first to fourth bidirectional memories 11, 12, 13, 14 in the stated order, the writing to the fourth bidirectional memory 14 and the reading from the fourth bidirectional memory 14 are simultaneously performed, and the first to fourth bidirectional memories 11, 12, 13, 14 have the periods in which the reading is simultaneously performed.

Therefore, the writing to the fourth bidirectional memory 14 and the reading from the fourth bidirectional memory 14 are simultaneously performed, and the first to fourth bidirectional memories 11, 12, 13, 14 have the periods in which the reading is simultaneously performed. This enables to suppress an output data rate to approximately 40% of an input data rate and to secure the blank period of the output data without depending on an input video signal in the display apparatus.

In the method for driving a display apparatus in the second preferred embodiment, the N or more bidirectional memories are the first to fourth bidirectional memories 11, 12, 13, 14, the write controller 1 performs the writing in the first to fourth bidirectional memories 11, 12, 13, 14 in the stated order in the repeating the write unit cycle, the writing to the fourth bidirectional memory 14 and the reading from the fourth bidirectional memory 14 are simultaneously performed in the repeating the write unit cycle and the repeating the read unit cycle, and the first to fourth bidirectional memories 11, 12, 13, 14 have the periods in which the reading is simultaneously performed in the repeating the read unit cycle.

Therefore, in the repeating the write unit cycle and the repeating the read unit cycle, the writing to the fourth bidirectional memory 14 and the reading from the fourth bidirectional memory 14 are simultaneously performed. In the repeating the read unit cycle, the first to fourth bidirectional memories 11, 12, 13, 14 have the periods in which the reading is simultaneously performed. This enables to suppress the output data rate to approximately 40% of the input data rate and to secure the blank period of the output data without depending on the input video signal in the display apparatus.

In the first and second preferred embodiments, the start position of the data reading in each of the memories is specified for the descriptions, but a start position of reading can actually be adjusted according to a usage state. Similarly, the number of memories is specified for the descriptions, but the number of memories is actually not limited and can be adjusted according to a usage state. Furthermore, the order in which input data is stored in the memories and the order in which the stored data is read from the memories can also be adjusted. The overlap period of output data and a frequency dividing ratio can timely be optimized or adjusted. The overlap period can be adjusted within a range in which overwriting a memory does not cause a loss of display data. The overlap period may preferably be adjusted according to a necessary blank period and a frequency dividing ratio. In the first and second preferred embodiments, the start position of the data reading in each of the memories, the overlap period of output data, and the frequency dividing ratio are set such that a time obtained by adding the read unit cycle and the read blank period does not exceed a time obtained by adding the write unit cycle and the write blank period.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A display apparatus, comprising:
   N driver integrated circuits (ICs);
   N or more bidirectional memories that simultaneously allow data writing and data reading;
   a phase locked loop that converts an input clock to an output clock;
   a write controller that writes data to said plurality of bidirectional memories in synchronization with said input clock; and
   a read controller that reads said data from said plurality of bidirectional memories and causes said data to be output to said plurality of driver ICs in synchronization with said output clock,
   wherein a frequency of said output clock is smaller than a frequency of said input clock and is larger than 1/N times the frequency of said input clock,
   said write controller repeats a write unit cycle with a write blank period, said write unit cycle being a cycle of sequentially writing said data to said plurality of bidirectional memories,
   said read controller repeats a read unit cycle with a read blank period, said read unit cycle being a cycle of reading said data from said plurality of bidirectional memories,
   said data writing and said data reading are simultaneously performed in at least one of said plurality of bidirectional memories,
   data is simultaneously read from at least two of said plurality of bidirectional memories, and
   a time obtained by adding said read unit cycle and said read blank period does not exceed a time obtained by adding said write unit cycle and said write blank period.

2. The display apparatus according to claim 1, wherein said N or more bidirectional memories are a first bidirectional memory, a second bidirectional memory, and a third bidirectional memory,
   said write controller performs writing in said first to third bidirectional memories in the stated order,
   writing to said third bidirectional memory and reading from said third bidirectional memory are simultaneously performed, and
   said first to third bidirectional memories have periods in which reading is simultaneously performed.

3. The display apparatus according to claim 1, wherein said N or more bidirectional memories are a first bidirectional memory, a second bidirectional memory, a third bidirectional memory, and a fourth bidirectional memory,
   said write controller performs writing in said first to fourth bidirectional memories in the stated order,
   writing to said fourth bidirectional memory and reading from said fourth bidirectional memory are simultaneously performed, and
   said first to fourth bidirectional memories have periods in which reading is simultaneously performed.

4. The display apparatus according to claim 1, wherein a frequency of said output clock is smaller than a frequency of said input clock and is larger than ½ times the frequency of said input clock.

5. A method for driving a display apparatus,
   said display apparatus comprising:
   N driver integrated circuits (ICs);
   N or more bidirectional memories that simultaneously allow data writing and data reading;
   a phase locked loop that converts an input clock to an output clock;
   a write controller that writes data to said plurality of bidirectional memories in synchronization with said input clock; and
   a read controller that reads said data from said plurality of bidirectional memories and causes said data to be output to said plurality of driver ICs in synchronization with said output clock,
   a frequency of said output clock being smaller than a frequency of said input clock and being larger than 1/N times the frequency of said input clock,
   said method for driving said display apparatus, comprising:
   repeating a write unit cycle with a write blank period by said write controller, said write unit cycle being a cycle of sequentially writing said data to said plurality of bidirectional memories; and
   repeating a read unit cycle with a read blank period by said read controller, said read unit cycle being a cycle of reading said data from said plurality of bidirectional memories, wherein
   in said repeating said write unit cycle and said repeating said read unit cycle, said data writing and said data reading are simultaneously performed in at least one of said plurality of bidirectional memories,
   in said repeating said read unit cycle, said data is simultaneously read from at least two of said plurality of bidirectional memories, and
   a time obtained by adding said read unit cycle and said read blank period does not exceed a time obtained by adding said write unit cycle and said write blank period.

6. The method for driving a display apparatus according to claim 5, wherein
   said N or more bidirectional memories are a first bidirectional memory, a second bidirectional memory, and a third bidirectional memory,
   in said repeating said write unit cycle, said write controller performs writing in said first to third bidirectional memories in the stated order,
   in said repeating said write unit cycle and said repeating said read unit cycle, writing to said third bidirectional memory and reading from said third bidirectional memory are simultaneously performed, and in said repeating said read unit cycle, said first to third bidirectional memories have periods in which reading is simultaneously performed.

7. The method for driving a display apparatus according to claim 5, wherein said N or more bidirectional memories are a first bidirectional memory, a second bidirectional memory, a third bidirectional memory, and a fourth bidirectional memory, in said repeating said write unit cycle, said write controller performs writing in said first to fourth bidirectional memories in the stated order, in said repeating said write unit cycle and said repeating said read unit cycle, writing to said fourth bidirectional memory and reading from said fourth bidirectional memory are simultaneously performed, and in said repeating said read unit cycle, said first to fourth bidirectional memories have periods in which reading is simultaneously performed.

8. The method for driving a display apparatus according to claim 5, wherein a frequency of said output clock is smaller than a frequency of said input clock and is larger than ½ times the frequency of said input clock.

* * * * *